(12) United States Patent
Aoki et al.

(10) Patent No.: US 6,483,195 B1
(45) Date of Patent: Nov. 19, 2002

(54) TRANSFER BUMP STREET, SEMICONDUCTOR FLIP CHIP AND METHOD OF PRODUCING SAME

(75) Inventors: Hitoshi Aoki, Yokohama (JP); Takeshi Hosomi, Yokohama (JP); Kensuke Nakamura, Yokohama (JP); Hideki Hara, Akita (JP); Masaaki Kato, Yokosuka (JP)

(73) Assignee: Sumitomo Bakelite Company Limited, Tokyo (JP)

( * ) Notice: Subject to any disclaimer, the term of this patent is extended or adjusted under 35 U.S.C. 154(b) by 0 days.

(21) Appl. No.: 09/523,063

(22) Filed: Mar. 9, 2000

(30) Foreign Application Priority Data

| Mar. 16, 1999 | (JP) | 11-069881 |
|---|---|---|
| Mar. 29, 1999 | (JP) | 11-087129 |
| Apr. 30, 1999 | (JP) | 11-124798 |
| May 11, 1999 | (JP) | 11-130653 |

(51) Int. Cl.[7] ............................................... H01L 29/40
(52) U.S. Cl. ...................................... 257/778; 438/613
(58) Field of Search ................................ 257/778, 737, 257/738; 438/613, 616, 614, 615, 617, 738

(56) References Cited

U.S. PATENT DOCUMENTS

| 5,506,756 A | * 4/1996 | Haley | 257/778 |
| 5,621,225 A | * 4/1997 | Shieh et al. | 257/81 |
| 5,841,198 A | * 11/1998 | Chia et al. | 257/780 |

FOREIGN PATENT DOCUMENTS

| JP | 7-217336 | 7/1992 |
| JP | 7-193068 | 7/1995 |
| JP | 08078420 A | * 3/1996 |
| JP | 08157566 A | * 6/1996 |
| JP | 8-8258 | 12/1996 |
| JP | 09148333 A | * 6/1997 |

* cited by examiner

*Primary Examiner*—Nathan J. Flynn
*Assistant Examiner*—Leonardo Andüjer
(74) *Attorney, Agent, or Firm*—Smith, Gambrell & Russell, LLP

(57) ABSTRACT

The invention relates to a low-cost transfer bump sheet which is capable of transferring copper-cored solder bumps with high reliability of bonding to a semiconductor chip and which is capable of transferring bumps of various structures. The invention also relates to a low-cost semiconductor flip chip in which copper-cored solder bumps with high reliability of bonding are mounted on a semiconductor chip through the use of the transfer bump sheet. In the transfer bump sheet, metal posts of two or more layers are formed on a base sheet. The invention also relates to a method of manufacturing this semiconductor flip chip, which comprises the steps of forming the base sheet on a metal foil, forming a plating mask on the metal foil, forming a first solder layer (solder coating) on the metal foil by electrolytic plating or electroless plating, removing the plating mask, and forming a metal layer (metal core) of metal posts by the etching of the metal foil through the use of the formed first solder layer (solder coating) as an etching mask.

13 Claims, 12 Drawing Sheets

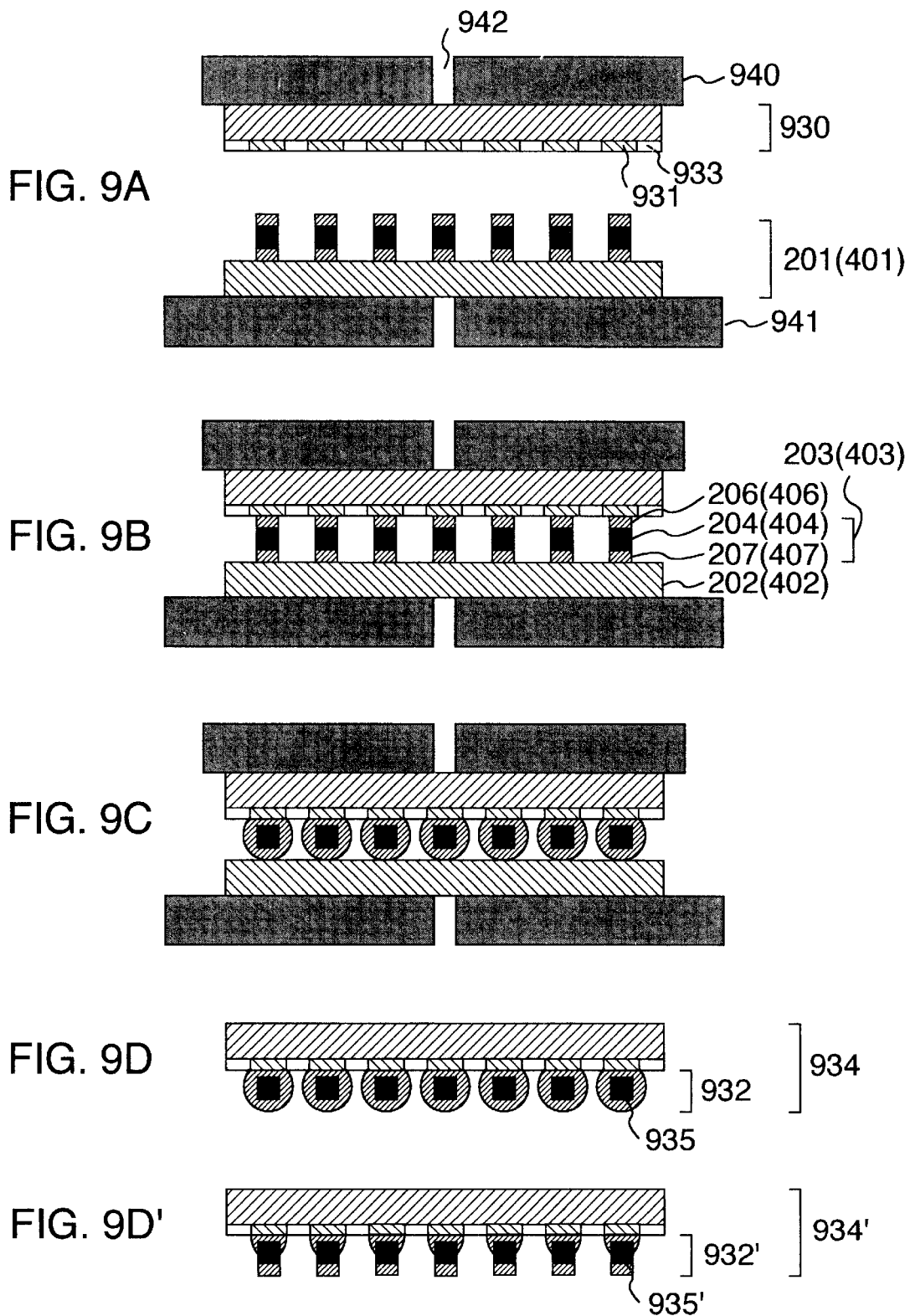

TRANSFER BUMP STREET, SEMICONDUCTOR FLIP CHIP AND METHOD OF PRODUCING SAME

FIELD OF THE INVENTION

The invention relates to a transfer bump sheet for mounting bumps for flip chip interconnection to a semiconductor chip by transferring all bumps at a time to the semiconductor chip, a semiconductor flip chip having a semiconductor chip on which bumps for flip chip interconnection are formed, and a method of manufacturing the semiconductor flip chip.

BACKGROUND OF THE INVENTION

In recent years, requirements for more functionality and miniaturization of electronic equipment have been increasing, and higher-density integration design and higher-density packaging design of electronic parts have been required accordingly. Therefore, the semiconductor packages used in such electronic equipment have been increasingly miniaturized and are provided with an increasingly large number of pins to a greater extent than in the past.

Conventional semiconductor packages which use lead frames have reached their limits on miniaturization and, therefore, new package methods of area array mount, such as BGA (Ball Grid Array) and CSP (Chip Scale Package), have recently been proposed as a package in which semiconductor chips are mounted on a substrate. In these semiconductor packages, wire bonding, TAB (Tape Automated Bonding), FC (Flip Chip) bonding, etc., are known as methods of electrical connection between pads of semiconductor chip and pads of substrate, which comprises one of various insulating material such as plastics and ceramics, and circuit trace, with a function of conventional lead frame. Recently, however, structures of BGA and CSP using FC bonding, which are favorable for the miniaturization of semiconductor packages, have frequently been proposed. In this FC bonding, bumps are usually formed beforehand on the pads of a semiconductor chip, the bumps being then located in correspondence to the terminals located on an interconnect substrate, and the bonding is performed by thermo-compression.

A vacuum evaporation method, printing method, solder ball aligning method, stud bump method, electrolytic plating method, and etc., are known as methods of directly forming bumps on a semiconductor chip (direct system).

In the vacuum evaporation method, Sn and Pb are evaporated through the use of a metal mask, and solder bumps are formed by means of a wet back. It is impossible to adopt this method in a case of narrow pitches because of the use of the metal mask. In addition, because the growth speed of bumps is low, it takes long time to form bumps for providing a required height, thus posing a problem.

In the printing method, solder-paste projections are formed by methods such as screen printing and are made to reflow, thereby forming solder bumps. This method is low in cost and has high productivity. However, in this method solder paste oozes during printing and sometimes comes into contact with the solder-paste projection formed on an adjoining pad. For this reason, it is difficult to adopt this method in a case of narrow pitches. On the other hand, when a printing method can be used in the case of narrow pitches, it becomes impossible to form bumps having a required height, thus posing a problem.

In the solder ball aligning method, ready-made solder balls are adsorbed with the aid of an adsorption tool provided with holes of the same alignment as the pad alignment of a semiconductor chip, which solder balls are then positioned on the pads of the semiconductor chip and are made to reflow, thereby forming solder bumps. The bump pitch depends on the solder ball diameter. Especially when solder balls are minute, dirt and dust on solder balls and the effect of static electricity sometimes induce failure in adsorption and the adhering of excessive solder balls or cause multiple solder balls to be adsorbed in a grape-like form by one hole of the adsorption tool. Thus, this method has the problem that solder bumps cannot be surely formed.

In the stud bump method, gold bumps or solder bumps are formed by bonding gold wires or solder wires to the pads of a semiconductor chip and cutting these wires. In this method, it is possible to cope with narrow pitches. When gold wires are used, gold bumps can be formed directly on the pads (aluminum pads) of a semiconductor chip and, therefore, there is an advantage that it is unnecessary to form barrier metal. In this method, however, because bumps are formed one by one on the pads of a semiconductor chip, the manufacturing time is long. In addition, the cost of manufacturing is high because the price of gold wire is high. Besides there is a fear that damage to a semiconductor chip may occur and, therefore, this poses the problem that this method cannot be adopted in a case of the area array mount.

In the electrolytic plating method, a plating mask is formed on a semiconductor chip, openings being formed in the positions of pads by exposure and development, and bumps are then formed by electrolytic plating. Because in this method bumps are formed to a required height by plating alone, the manufacturing time is long and the cost of the manufacturing is high. Further, because in the electrolytic plating method it is difficult to make the current density distribution in a plating bath completely uniform, variations in the height of formed bumps occur. The longer the plating time, the more remarkable variations in the height of the formed bumps become and, therefore, it is difficult to solve the problem insofar as the method of forming bumps by plating alone is concerned.

As mentioned above, the direct systems have various problems, and an improvement in the yield of bump forming is the greatest interest.

On the other hand, a transfer bump method has also been developed. In this method, an improvement in yield is aimed by transferring all bumps judged to have good quality to a semiconductor chip at a time. By locating a transfer bump sheet in place, in which bumps have been formed beforehand, in correspondence to a semiconductor chip and by performing heating and pressurization, all the bumps on the transfer bump sheet are transferred to the semiconductor chip at a time.

Methods of forming bumps on a transfer bump sheet, which have hitherto been known, are the vacuum evaporation method, printing method, bump punching method, electrolytic plating method, etching method, and etc.

The vacuum evaporation method has the problem that it is difficult to cope with narrow pitches and the problem that it takes time to form bumps as in the above vacuum evaporation method.

The printing method has the problem that it is difficult to cope with narrow pitches and the problem that bumps cannot be formed to a required height although the cost is low with high productivity similarly to the above printing method.

In the bump punching method, a metal ribbon is punched in the shape of bumps by means of a die and a punch and the bumps are aligned on a base sheet. Although this method has the advantage that the material for the metal ribbon can be freely selected, it has the problem that the manufacturing time is long because bumps are formed one by one on the base sheet. Further, although narrow pitches can be coped with by reducing the punch diameter, the service life of the punch becomes short because of its small diameter, thus posing a problem.

The electrolytic plating method has the problem that the manufacturing time is long and the cost of manufacturing is high and that variations in the height of bumps occur similarly to the above electrolytic plating method.

In the etching method, bumps are formed by etching a metal foil on a base sheet. Because bumps are formed by etching the metal foil, the manufacturing time can be shortened in comparison with the method of forming bumps by electrolytic plating. In addition, this method has the advantage that the bump height can be made uniform by making use of a metal foil with a uniform thickness. As the examples of the metal foil, there are known gold foil, solder foil and copper foil. In the case of using the gold foil, because bumps are made to remain in necessary portions by etching the gold foil, almost all of gold portions are removed by etching. This inevitably leads to a high cost of manufacturing. Further, it is very difficult to etch only the gold foil without eroding a base sheet. On the other hand, in the case of using a solder foil as metal foil, although solder foil is inexpensive in comparison with gold foil, it is still expensive in comparison with usual metal foil such as copper foil and besides procurement is limited. Further, in this case of the solder foil, the controlling of etching process is difficult, so that the manufacturing cost thereof can not help rising. In the case of the copper foil, the cost is low and the procurement thereof can be readily performed, however, there is such a problem as it can not be used as a bonding metal such as gold or solder.

On the other hand, in comparison with the direct system, a transfer system has such an advantage as only bumps which were judged to be good can be used. Thus, the most important problem of the transfer system is the yield of the bump transfer (the rate of transfer), and one of the important characteristics of the transfer system is adhesion occurring between a base sheet and bumps on the base sheet. Namely, the adhesion between the base sheet and the bumps is required to be, at the time of producing a transfer bump sheet, in a level at which the bumps surely adhere to the base sheet, and is required to be smaller than a bonding force occurring between a semiconductor chip after the bump transfer and bumps having been transferred. In conventional transfer bump sheets, the adhesion between the base sheet and the bumps was controlled to be within the above-explained range, however, this range was too narrow and was hard to be controlled, so that it was impossible to keep a sufficiently high transfer rate, or the yield of the transfer bump sheet was sacrificed.

In recent years, in order to ensure the reliability of bump bonding (for example, bonding strength after exposed to a high temperature), the use of bumps each having a metal core, such as copper-core solder bumps, instead of bumps made of solder alone has been proposed. In the ball aligning method, the reliability of bump bonding can be ensured by using ready-made copper-core solder balls. However, this leads to a substantial cost increase in comparison with the use of usual solder balls. Further, in the bump punching method, the metal core can be formed by using a metal ribbon in which both sides of copper foil are plated with solder. However, because of the problems in the bump punching method itself, it is difficult to adopt this measure.

In the electrolytic plating method, it is possible to form copper-core solder bumps by reflow after the steps of solder plating, copper plating and solder plating. However, the cost of manufacturing increases because the manufacturing steps becomes more complex. On the other hand, in each of the vacuum evaporation method, printing method and stud bump method, it is impossible to form copper-core solder bumps.

SUMMARY OF THE INVENTION

The present invention was achieved as a result of intensive research performed to address the above problems in the structures and manufacturing methods of conventional transfer bump sheets.

Therefore, an object of the invention is to provide in a low cost and with a high yield a transfer bump sheet capable of transferring copper-core solder bumps with high bonding reliability to a semiconductor chip, which transfer bump sheet can transfer bumps with no substantial height variation at a time to a semiconductor chip and which transfer bump sheet has such reliability as no failure in transferring occurs (, that is, transferring ratio of 100% can be realized).

Another object of the invention is to provide in a low cost a semiconductor flip chip in which copper-core solder bumps with high reliability of bonding are mounted on a semiconductor chip through the use of this transfer bump sheet.

In the invention there is provided a transfer bump sheet for mounting bumps for flip chip interconnection to a semiconductor chip by transferring all of the bumps at a time to the semiconductor chip, comprising a base sheet for the transfer bump sheet, and metal posts located on the base sheet, each of the metal posts comprising at least a metal core and a solder coating, the metal core being formed by etching a metal foil, and the solder coating covering at least a part of surface of the metal core.

Also, in this invention there is provided a semiconductor flip chip having a semiconductor chip in which bumps for flip chip interconnection are formed, each of these bumps being provided with a metal core formed by etching a metal foil and a solder coating covering a part or whole surface of the metal core.

Also, in this invention there is provided a method of manufacturing a semiconductor flip chip, comprising the steps of preparing a transfer bump sheet according to the invention, locating the metal posts at positions corresponding to positions of pads provided in the semiconductor flip chip, and transferring all of the metal posts at a time by use of the transfer bump sheet.

In the transfer bump sheet of the invention, the metal posts comprises with at least a metal core formed by etching a metal foil, and a solder coating which covers a part or whole surface of the metal core. This metal post is preferably made of the two layers of a metal layer (metal core) and a first solder layer (solder coating) in the order from the base sheet of the transfer bump sheet. Alternatively, this metal post is preferably made of the three layers of a second solder layer (solder coating), a metal layer (metal core) and a first solder layer (solder coating) in this order from the base sheet.

The semiconductor flip chip of the invention preferably comprises a semiconductor chip in which bumps for flip chip interconnection are formed, each of the bumps comprises a metal core formed by etching a metal foil, and a solder coating covering a part or whole surface of the metal core. The material for the metal core is preferably copper.

The semiconductor flip chip of the invention comprises a semiconductor chip in which bumps for flip chip interconnection are formed. These bumps are formed by transferring all metal posts at a time through the use of the above transfer bump sheet.

The method of manufacturing a semiconductor flip chip of the invention comprises forming bumps for flip chip interconnection on a semiconductor chip by transferring in place all metal posts at a time in correspondence to the positions of the pads of the semiconductor chip by use of the above transfer bump sheet

BRIEF DESCRIPTION OF THE DRAWINGS

FIGS. 9a to 9d' are sectional views which show a method of transferring all bumps at a time to a semiconductor chip (method of manufacturing a semiconductor flip chip) through the use of the transfer bump sheet according to the second and fourth embodiments of the invention.

DESCRIPTION OF THE PREFERRED EMBODIMENTS

Figure 1A:
FIGS. 1a to 1e are sectional views which show an example of a method of manufacturing a transfer bump sheet according to the first embodiment of the invention.
Figure 1B:

The metal core and metal layer of each of the metal posts constituting the transfer bump sheet of the invention (the metal core and metal layer becoming the core of each bump) may be formed from any metal or alloy insofar as it can be etched. However, it is preferred that the metal core and metal layer be formed by etching through the use of a metal foil such as copper foil which can be easily obtained. By using copper it is possible to substantially reduce electric resistance and besides an improvement in the reliability of the bonding of bumps can be expected. Metals or alloys other than copper can be used in the transfer bump sheet of the invention insofar as they can be etched and are suitable as the cores of bumps.

The reason why the metal core is formed by etching the metal foil is that variations in the height of metal cores are reduced by this method. Metal cores formed of the copper foil, which can be easily obtained, have very small variations in thickness even when they do not belong to the same lot. For this reason, the copper foil is most suitable for the metal cores of the transfer bump sheet of the invention.

Any solder which can be provided by electrolytic plating or electroless plating may be used as the solder used in both of the solder coating and solder layer. For example, a eutectic Sn—Pb solder can be used. Further, so-called lead-free solders whose development has recently been pursued, such as Sn—Sb-based, Sn—Cu-based and Sn—Ag-based solders, can be used insofar as the plating thereof can be performed.

Any base sheet can be used insofar as it is suitable for the transfer bump sheet of the invention. However, a resin is preferred in order to form the metal foil for the metal core on the base sheet. Although it is possible to form a metallic base sheet by the electrolytic plating or electroless plating on a metal foil, it is difficult to ensure the exfoliation between the metal posts and the base sheet during the transfer of the metal posts. Further, when the base sheet is formed of a resin, it can withstand an etching step during the formation of the metal core.

Further, it is preferred to use, as the base sheet, a resin and a reinforcing plate formed on the resin surface opposed to the metal posts. As the material for the reinforcing plate, a metal, in particular copper (a copper sheet or a copper foil), which can be easily obtained and is inexpensive, is preferred. When the base sheet is made of a resin alone, the controlling of dimensional behavior and stable transfer of the metal posts become difficult because of a large coefficient of linear expansion and shrinkage of resin during the curing thereof. On the other hand, in a case where the base sheet is formed of both of a resin and a reinforcing plate made of a copper foil or a copper sheet, the dimensional behavior of the base sheet is stable because the dimensional behavior of the reinforcing plate is stable, enabling the stable transfer of the metal posts. Further, because the base sheet has the reinforcing plate, the transfer bump sheet comes to have rigidity and the handling characteristic during manufacturing and use is improved.

As the resin used in the base sheet, one of resins, such as epoxy resins, maleimide resins, fluoro-resin, acrylic resins and silicone resins, or a mixture of two or more of the above resins can be used, and thermoplastics excellent in sheet formability may be mixed. However, it is preferred to use resins whose adhesion to the metal posts decreases at about the temperature at which the bumps are transferred so that the exfoliatability between the metal posts and the base sheet is ensured. For this purpose, it is effective to use resins with high elastic modulus of elasticity. Resins with high elastic modulus and narrow elastic region (broad glass region) are incapable of shrinking in correspondence to both of such compression at high temperatures as to occur during the transfer of the bumps and such stretching as to occur during cooling and, as a consequence, bonding portions (, that is, interface between the metal post and the resin) are apt to break due to stress concentration. Further, it is also possible to make use of decomposition occurring by oxidation during heating at high temperatures. Therefore, a resin composed of a mixture of a highly-crosslinking, thermosetting resin and a photo-polymerization resin is preferred. In particular, a resin comprising (a) a multifunctional epoxy resin, (b) an epoxy resin hardener, (c) a photopolymerization monomer, (d) a photopolymerization initiator, and (e) an inorganic filler is more preferred.

As the epoxy resin used in this resin, any kind of multifunctional epoxy resin may be used. However, when an epoxy resin which is a solid at room temperature is used, it is preferred to also use a liquid epoxy resin in combination with this solid epoxy resin in view of the characteristics of the base sheet and the laminatability of both of the base sheet and the reinforcing plate, etc. As the epoxy resin hardener, various types of hardeners which are usually used, such as diamine, acid anhydride and imidazole, can be used. In this case, it is preferred to use a combination from which a cured resin material of highly-crosslinking structure and with high elastic modulus can be obtained. As the photopolymerization monomer, any type of monomer may be used insofar as it can dissolve a solid epoxy resin, polymerize and cure this resin by irradiation with activation energy beams and insofar as the resin partially oxidizes and decomposes in the vicinity of the temperature at which the metal posts are transferred so that the adhesion thereof to the metal posts decreases. As the photopolymerization initiator, benzoin alkyl ethers, acetophenones, thioxanthones, alkyl anthraquinones, etc., can be used. As the inorganic filler, crystalline silica, fused silica, comminuted silica, alumina, and clay calcium carbonate, etc., can be used. By adding these inorganic fillers, a cured resin with higher elastic modulus can be obtained. A resin obtained by appropriately blending these compositions can be used in the invention and, further, a resin obtained by adding additives such as an ultraviolet inhibitor, heat polymerization inhibitor and plasticizer may be used as occasion demands.

By applying such a solvent-free liquid resin as mentioned above to a metal foil by a method such as screen printing and roll coater and by irradiating the resin with activation energy beams with the aid of an exposure system such as a UV conveyor etc., only photopolymerization resin components are polymerized and a cured thermosetting resin layer is obtained. As the activation energy beams, ultraviolet rays, electron beams, etc., can be used, however, in view of the ease of treating and cost performance, it is preferred to use ultraviolet rays. Further, by laminating a reinforcing plate on the cured thermosetting resin layer by heating and pressurization, it is possible to form a base sheet comprising the resin and the reinforcing plate. Because the thermosetting resin layer is formed of a solvent-free liquid resin, there is no possibility that a solvent vaporizes when the thermosetting resin layer is sealed with the metal foil and the reinforcing plate during the lamination of the reinforcing plate, so that no bubble occurs.

The solvent-free liquid resin used in the invention is such that after the manufacturing of the transfer bump sheet, the photopolymerization resin and thermosetting resin are polymerized and cured to thereby provide the function of holding the metal posts, and that after the transfer of the metal posts, the photopolymerization resin is decomposed by thermal history to thereby provide exfoliatability of the metal posts.

The embodiments of the present invention are explained below by referring to the drawings which, however, are not intended to restrict the scope of the invention in any way.

Figure 1C:
Figure 1D:
Figure 1E:
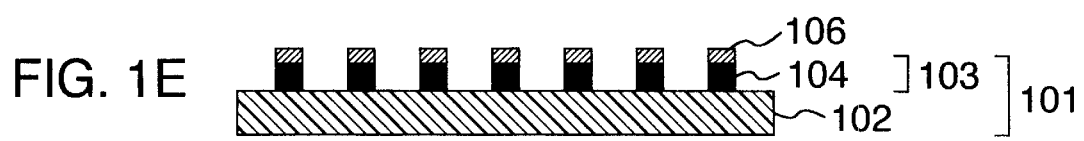

FIGS. 1a to 1e are explanatory drawings showing a method of manufacturing a transfer bump sheet according to the first embodiment of the invention, and FIG. 1e is a sectional view which shows the structure of a transfer bump sheet obtained by the first manufacturing method. A transfer bump sheet 101 is formed of a base sheet 102 and metal posts 103 and each of the metal posts 103 is formed of a metal layer (metal core) 104 and a first solder layer (solder coating) 106.

In the first manufacturing method, a two-layer sheet formed of the base sheet 102 and a metal foil 110 is first prepared (FIG. 1a). The two-layer sheet may be obtained by laminating the metal foil 110 to the base sheet 102 by heating and pressurization. Alternatively, the two-layer sheet may also be obtained by uniformly applying a resin varnish onto the metal foil 110 and then by performing drying. Further, the two-layer sheet can also be obtained by uniformly applying a solvent-free liquid resin, which is composed of a mixture comprising a photopolymerization resin and a thermosetting resin, onto the metal foil 110 and then by irradiating the resin with activation energy beams. Next, a plating mask 120 is formed on the metal foil 110 (FIG. 1b) and subsequently the first solder layer (solder coating) 106, which constitutes a part of the metal post 103, is formed on the metal foil 110 by electrolytic plating or electroless plating (FIG. 1c). After that, the plating masks 120 are exfoliated (FIG. 1d), the metal foil 110 being etched through the use of the formed first solder layer (solder coating) 106 as an etching mask, and the metal layer (metal core) 104 which constitutes a part of the metal post 103 is formed (FIG. 1e). The transfer bump sheet 101 of the invention is thus obtained.

Figure 8A:
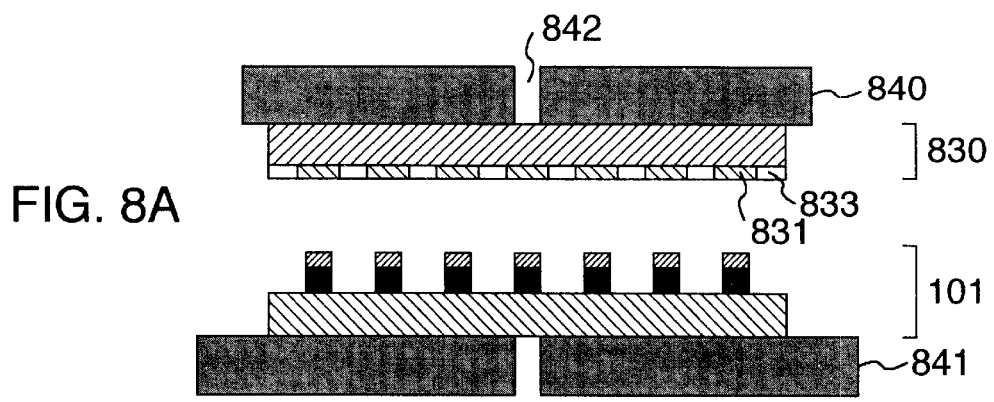
FIGS. 8a to 8d' are sectional views which show a method of transferring all bumps at a time to a semiconductor chip (method of manufacturing a semiconductor flip chip) through the use of the transfer bump sheet according to the first embodiment of the invention.
Figure 8B:
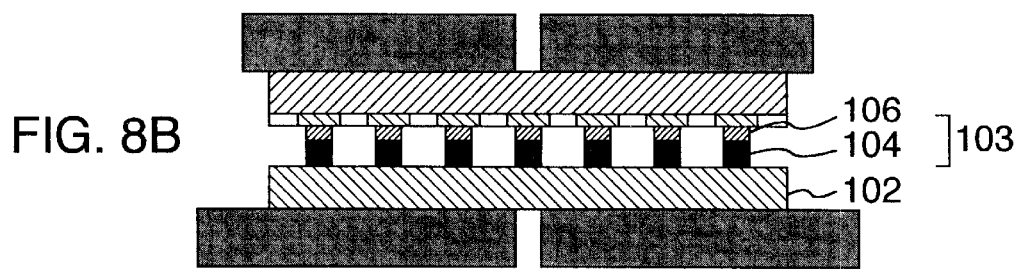
Figure 8C:
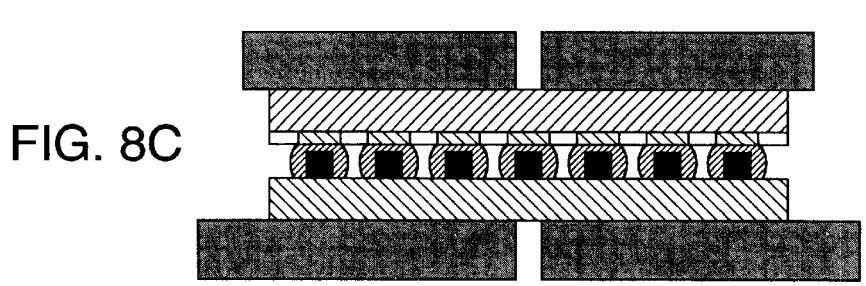
Figure 8D:
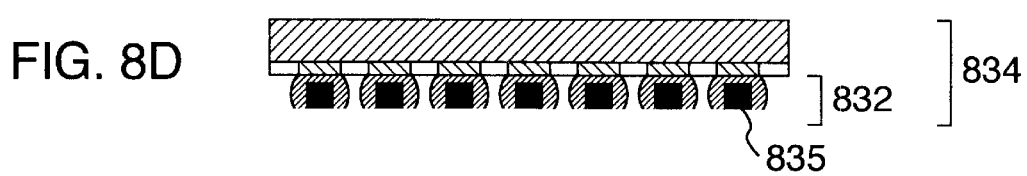
Figure 8D:
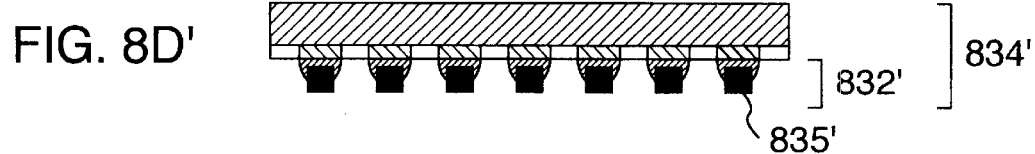

FIGS. 8a to 8d are explanatory drawings of a method of transferring all bumps at a time to a semiconductor chip, i.e., a method of manufacturing a semiconductor flip chip through the use of the transfer bump sheet 101 obtained by the first manufacturing method, and FIG. 8d is a sectional view which shows the structure of a semiconductor flip chip obtained by this manufacturing method. The transfer bump sheet 101 is first placed in a required position of a heating and pressurizing stage 841 of a bonding device and a semiconductor chip 830 is adsorbed on a heating and pressurizing tool 840 provided with an adsorption hole 842. Positioning marks formed beforehand on the transfer bump sheet 101 and semiconductor chip 830 are read by means of an image recognition device and the metal posts 103 on the transfer bump sheet 101 and pads 831 on the semiconductor chip 830 are opposed and accurately positioned (FIG. 8a). Next, by lowering the heating and pressurizing tool 840, the semiconductor chip 830 is pressed against the transfer bump sheet 101 in parallel to this transfer bump sheet at a required temperature and under a required pressure (FIG. 8b). When the first solder layer (solder coating) 106 has reached the melting temperature, a part of the first solder layer (solder coating) 106 flows onto the sides of the metal layer (metal core) 104 and is deformed to be a shape of balanced surface tension (FIG. 8c). The heating and pressurizing tool 840 is raised after heating and pressurization for a required period of time, and the semiconductor chip 830 and transfer bump sheet 101 are removed from the heating and pressurizing tool 840. By removing the base sheet 102 after the solidification of the solder layer (solder coating) 106, a semiconductor flip chip 834 to which all bumps 832 have been transferred at a time is obtained (FIG. 8d).

In the transfer bump sheet 101 according to the first embodiment, solder coatings are not formed on the sides of the metal layer (metal core) 104 forming the metal post 103 and, therefore, when the first solder layer (solder coating) 106 has reached a melting temperature, it is necessary to cause a part of the solder layer (solder coating) 106 to flow onto the sides of the metal layer (metal core) 104. When an applied pressure is low or when the wettability of solder to the metal layer (metal core) 104 is inferior, a part of the solder layer (solder coating) 106 does not flow onto the sides of the metal layer (metal core) 104. However, this can be easily solved by optimizing pressure and temperature, and/or by improving wettability or optimizing the amount of solder of the first solder layer (solder coating) 106. Conversely, by appropriately adjusting them, it is also possible to ensure that a part of the first solder layer (solder coating) 106 is prevented from flowing onto the sides of the metal layer (metal core) 104 (refer to FIG. 8*d*').

The metal layer (metal core) 104 which occupies the greater part of each metal post 103 is formed by a method which comprises etching the metal foil 110 of uniform thickness and, for this reason, the thickness of the metal layer (metal core) 104 of each metal post 103 is very uniform. In a case where the first solder layer (solder coating) 106 is formed by electroless plating, the thickness of the first solder layer (solder coating) 106 becomes very uniform. When electroless plating is displacement plating, the thickness of the first solder layer (solder coating) 106 varies in some degree, however, the thickness of the metal post 103 is not affected. Therefore, the thickness of the metal post 103 is very uniform and failure in the transfer of bumps due to variations in the thickness of the metal post 103 does not occur. On the other hand, when the first solder layer (solder coating) 106 is formed by electrolytic plating, variations in the thickness of the first solder layer (solder coating) 106 occurs in some degree. However, these thickness variations are so small that they can be neglected in comparison with the conventional technique by which bumps are formed by electrolytic plating alone. Therefore, when bumps are formed on a semiconductor chip through the use of the transfer bump sheet 101 of the first embodiment, variations in bump height scarcely occur.

In a case where the transfer bump sheet 101 of the first embodiment is used, as is apparent from FIG. 8*d* or FIG. 8*d*', on the end face (bottom surface in each drawing) of the transfered bump 832, 832', there is exposed the metal core 835, 835' of the bump 832, 832'. In a case where the amount of first solder layer (solder coating) 106 is small, bonding by solder may sometimes become difficult when mounting the semiconductor flip chip 834, 834' on a substrate. However, this problem can be solved by adjusting the amount of solder so that the solder flows onto the exposed surface of the metal core 835, 835' during the mounting.

Figure 2A:
FIGS. 2a to 2f are sectional views which show an example of a method of manufacturing a transfer bump sheet according to the second embodiment of the invention.
Figure 2B:
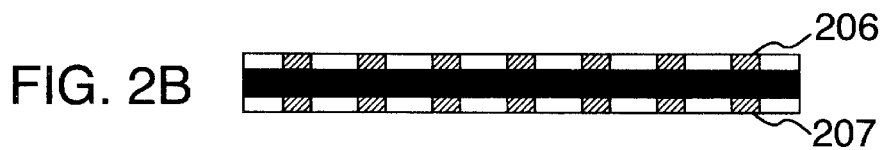
Figure 2C:
Figure 2D:
Figure 2E:
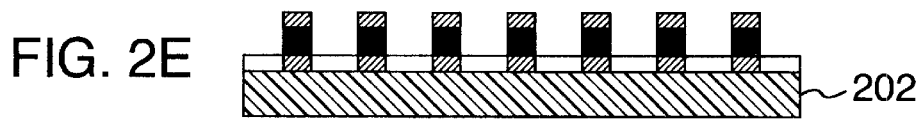
Figure 2F:
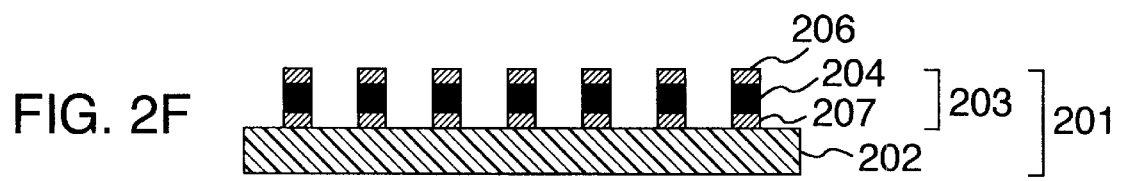

FIGS. 2*a* to 2*f* are explanatory drawings showing a method of manufacturing a transfer bump sheet according to the second embodiment of the invention, and FIG. 2*f* is a sectional view which shows the structure of a transfer bump sheet obtained by the second manufacturing method. A transfer bump sheet 201 is formed of a base sheet 202 and metal posts 203 and each of the metal posts 203 is formed of three layers, which are a metal layer (metal core) 204, a first solder layer (solder coating) 206 and a second solder layer (solder coating) 207.

In the second manufacturing method, a plating mask 220 is first formed on the two surfaces of the metal foil 210 (FIG. 2*a*). On this occasion, it is important that openings of the plating mask 220 on both surfaces of the metal foil 210 are accurately positioned. Next, by performing electrolytic plating or electroless plating, the first solder layer (solder coating) 206 and second solder layer (solder coating) 207, which constitute a part of each metal post 203, are formed on both surfaces of the metal foil 210 (FIG. 2*b*) and subsequently the base sheet 202 is formed on the surface on which the second solder layer (solder coating) 207 of metal foil 210 was formed (FIG. 2*c*). The base sheet 202 may be formed by a method of laminating the base sheet, or by another method which comprises uniformly applying a resin varnish and then drying the varnish, or by still another method which comprises uniformly applying a solventless liquid resin and then irradiating the resin with activation energy beams. After that, the metal masks 220 on the side not in contact with the base sheet 202 are exfoliated (FIG. 2*d*) and the metal foil 210 is etched through the use of the formed first solder layer (solder coating) 206 as an etching mask, and the metal layer (metal core) 204 which constitutes a part of each metal post 203 is formed (FIG. 2*e*). Finally, the plating masks 220 in contact with the base sheet 202 are removed (FIG. 2*f*). The transfer bump sheet 201 of the invention is thus obtained.

When the adhesion between each metal post 203 and the base sheet 202 is low, the exfoliation of each metal post 203 from the base sheet 202 can be prevented by omitting the step (FIG. 2F) of removing the plating masks 220 to thereby ensure the adhesion between the base sheet 202 and the plating masks 220. Further, the adhesion may be improved by subjecting both or either of the second solder layer (solder coating) 207 and the base sheet 202 to surface treatment.

FIGS. 9*a* to 9*d*' are explanatory drawings showing a method of transferring all bumps at a time to a semiconductor chip, i.e., a method of manufacturing a semiconductor flip chip through the use of the transfer bump sheet 201 obtained by the second manufacturing method, and FIG. 9*d* is a sectional view which shows the structure of a semiconductor flip chip obtained by this manufacturing method. The method of transfer is the same as in the case where the transfer bump sheet 101 according to the above first embodiment is used. However, the behavior of the solder layers (solder coatings) during transfer is different from that of the first embodiment. More specifically, by the heating and pressurizing of the transfer bump sheet 201 and semiconductor chip 930 (FIG. 9*b*), a part of the first solder layer (solder coating) 206 and second solder layer (solder coating) 207 flow onto the sides of the metal layer (metal core) 204 when both solder layers (solder coatings) 206, 207 have reached the melting point. In each of the bumps 932 thus transferred, a metal core 935 is enveloped in the inside of the bump 932 and is not exposed to the surface. On the other hand, by adjusting pressure and temperature and/or by adjusting wettability and/or by adjusting the amount of solder of the two solder layers (solder coatings) 206, 207, it is also possible to prevent a part of the two solder layers (solder coatings) 206, 207 from flowing onto the sides of a metal core 935' (refer to FIG. 9*d*').

The metal layer (metal core) 204 which occupies a larger part of each metal post 203 is formed by a method which comprises etching the metal foil 210 of uniform thickness and, for this reason, the thickness of the metal layer (metal core) 204 of each metal post 203 becomes very uniform. When the two solder layers (solder coatings) 206, 207 are formed by electroless plating, the thickness of the two solder layers (solder coatings) 206, 207 becomes very uniform. When electroless plating is displacement plating, the thickness of the two solder layers (solder coatings) 206, 207 varies in some degree, however the thickness of each metal post 203 is not affected. Therefore, the thickness of each metal post 203 becomes very uniform and failure in the transfer of bumps due to variations in the thickness of each metal post 203 does not occur. On the other hand, when the two solder layers (solder coatings) 206, 207 are formed by electrolytic plating, variations in the thickness of the two solder layers (solder coating) 206, 207 occurs in some degree. However, these thickness variations are so small that they can be neglected in comparison with the conventional technique by which bumps are formed by electrolytic plating alone. Therefore, when bumps are formed on a semiconductor chip through the use of the transfer bump sheet 201 of the second embodiment, variations in bump height scarcely occur.

Figure 3A:
FIGS. 3a to 3e are sectional views which show an example of a method of manufacturing a transfer bump sheet according to the third embodiment of the invention.
Figure 3B:
Figure 3C:
Figure 3D:
Figure 3E:
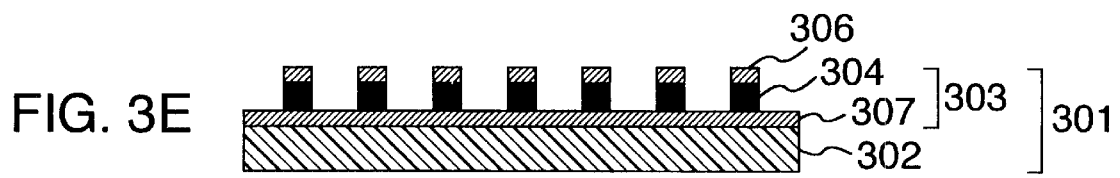

FIGS. 3a to 3e are explanatory drawings showing a method of manufacturing a transfer bump sheet according to the third embodiment of the invention, and FIG. 3e is a sectional view which shows the structure of a transfer bump sheet obtained by the third manufacturing method. A transfer bump sheet 301 is formed of a base sheet 302 and metal posts 303 and each of the metal posts 303 is formed of three layers, which are a metal layer (metal core) 304, a first solder layer (solder coating) 306 and a second solder layer (solder coating) 307 connected to all over the metal posts 303.

In the third manufacturing method, a plating mask 320 is first formed on one surface of the metal foil 310 (FIG. 3a). Next, by performing electrolytic plating or electroless plating, the first solder layer (solder coating) 306 and second solder layer (solder coating) 307, which constitutes a part of each metal post 303, are formed on both surfaces of the metal foil 310 (FIG. 3b) and subsequently the base sheet 302 is formed on the surface on which the second solder layer (solder coating) 307 was formed (FIG. 3c). The base sheet 302 may be formed by a method of laminating the base sheet, or by another method which comprises uniformly applying a resin varnish and then drying the varnish, or by still another method which comprises uniformly applying a solventless liquid resin and then irradiating the resin with activation energy beams. After that, the plating masks 320 on the side not in contact with the base sheet 202 are exfoliated (FIG. 3d), the metal foil 310 being then etched through the use of the formed first solder layer (solder coating) 306 as an etching mask, and the metal layer (metal core) 304 which constitutes a part of each metal post 303 is formed (FIG. 3e). The transfer bump sheet 301 of the invention is thus obtained.

When the adhesion between the second solder layer (solder coating) 307 and the base sheet 302 is low, the adhesion may be improved by subjecting the second solder layer (solder coating) 307 or base sheet 302 to a surface treatment similarly to the second embodiment.

Figure 10A:
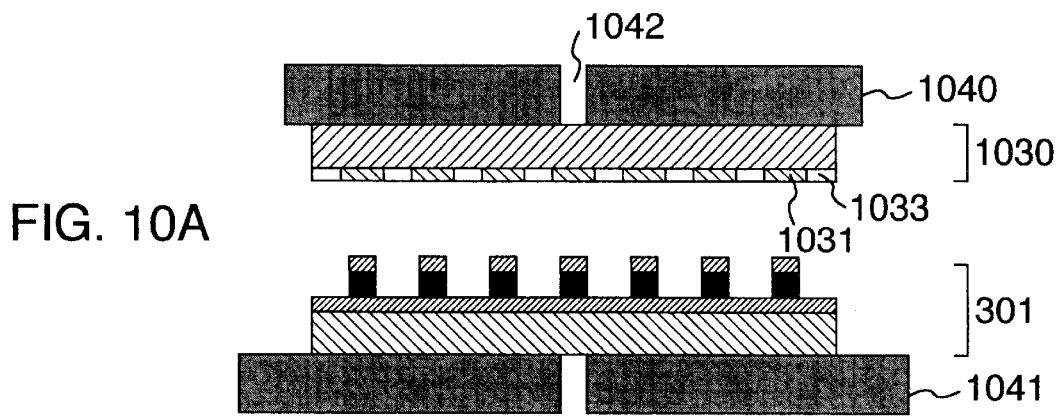
FIGS. 10a to 10d are sectional views which show a method of transferring all bumps at a time to a semiconductor chip (method of manufacturing a semiconductor flip chip) through the use of the transfer bump sheet according to the third embodiment of the invention.
Figure 10B:
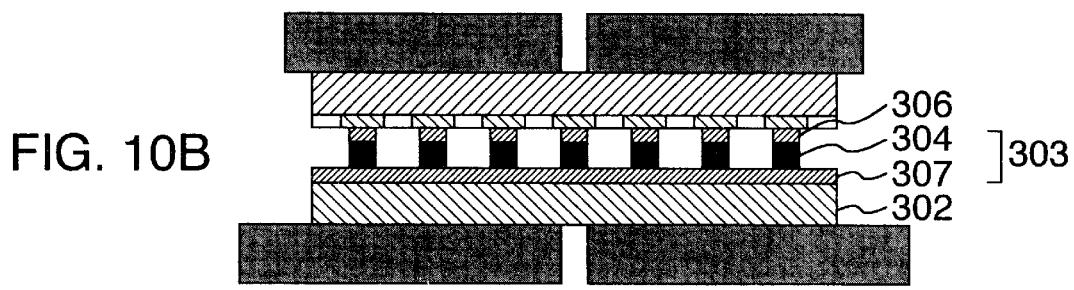
Figure 10C:
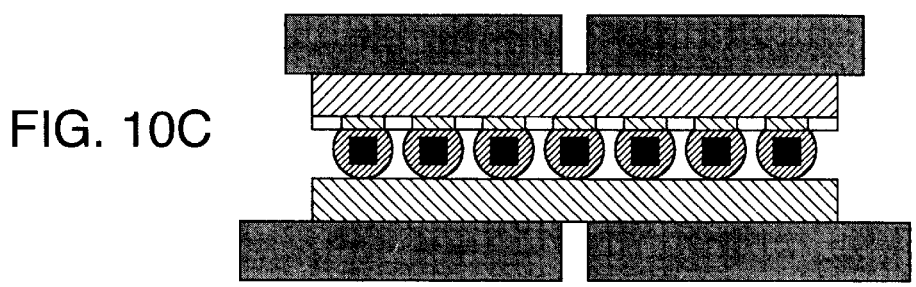
Figure 10D:
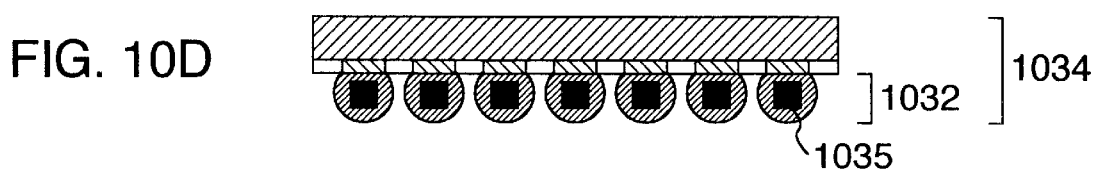

FIGS. 10a to 10d are explanatory drawings showing a method of transferring all bumps at a time to a semiconductor chip, i.e., a method of manufacturing a semiconductor flip chip through the use of the transfer bump sheet 301 obtained by the third manufacturing method, and FIG. 10d is a sectional view which shows the structure of a semiconductor flip chip obtained by this manufacturing method. The method of transfer is the same as in the case where the transfer bump sheet 101 according to the above first embodiment is used. However, the behavior of the solder layers (solder coatings) during transfer is different from that of the first embodiment. More specifically, because the second solder layer (solder coating) 307 is connected to all over the metal posts 303, it appears that during transfer, adjacent metal posts 303 might be bridged because of the presence of the second solder layer (solder coating) 307. However, no bridging occurs in a case where the amount of solder of the second solder layer (solder coating) 307 is appropriately adjusted. Moreover, since passivation films 1033 are formed near pads 1031 of a semiconductor chip 1030 to thereby make the wettability of the solder inferior, the bridging is not apt to occur.

It is easy to adjust the amount (thickness) of solder of the second solder layer (solder coating) 307. For example, a method for reducing the amount (thickness) of solder of the second solder layer (solder coating) 307 in comparison with the amount (thickness) of solder of the first solder layer (solder coating) 306 is described below. In FIG. 3a, when forming of the plating mask 320 on one surface of the metal foil 310, plating mask is also formed on the whole area of the other surface. Then, by performing electrolytic plating or electroless plating, the first solder layer (solder coating) 306 is formed only for a required period of time so that the first solder layer (solder coating) 306 may not have a targeted thickness. By exfoliating the plating masks formed on the whole area of the other surface and by performing electrolytic plating or electroless plating, the first solder layer (solder coating) 306 is made to have the targeted thickness. In this manner, the amount (thickness) of solder of the second solder layer (solder coating) 307 can be reduced in comparison with the amount (thickness) of solder of the first solder layer (solder coating) 306. By adjusting the time when the plating masks formed on the whole surface is removed, the amount (thickness) of solder of the second solder layer (solder coating) 307 can be adjusted. On the other hand, in a case where the amount (thickness) of solder of the second solder layer (solder coating) 307 is to be increased in comparison with the amount (thickness) of solder of the first solder layer (solder coating) 306, in contrast with the above method, a plating mask is formed on the whole area of the surface on which the first solder layer (solder coating) 306 of the metal foil 310 is to be formed and after that, the first solder layer (solder coating) 306 and the second solder layer (solder coating) 307 are formed in the steps similar to the above.

The metal layer (metal core) 304 which occupies a large part of each metal post 303 is formed by a method which comprises etching the metal foil 310 of uniform thickness and, for this reason, the thickness of the metal layer (metal core) 304 of each metal post 303 becomes very uniform. When the two solder layers (solder coatings) 306, 307 are formed by electroless plating, the thickness of the two solder layers (solder coatings) 306, 307 is very uniform. When electroless plating is displacement plating, the thickness of the two solder layers (solder coatings) 306, 307 varies in some degree, however, the thickness of the metal post 303 is not affected. Therefore, the thickness of each metal post 303 is very uniform and failure in the transfer of bumps due to variations in the thickness of each metal post 303 do not occur. On the other hand, when the two solder layers (solder coatings) 306, 307 are formed by electrolytic plating, variations in the thickness of the metal post 303 occurs in some degree. However, these thickness variations are so small that they can be neglected in comparison with the conventional technique by which bumps are formed by electrolytic plating alone. Therefore, when bumps are formed on a semiconductor chip through the use of the transfer bump sheet of the third embodiment, variations in bump height scarcely occur.

Figure 4A:
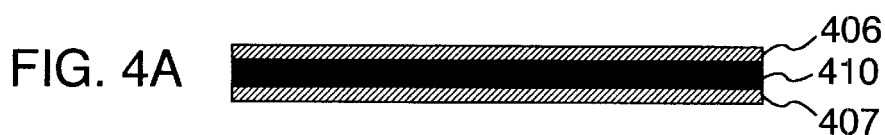
FIGS. 4a to 4e are sectional views which show an example of a method of manufacturing a transfer bump sheet according to the fourth embodiment of the invention.
Figure 4B:
Figure 4C:
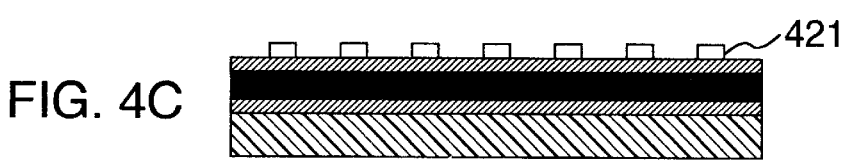
Figure 4D:
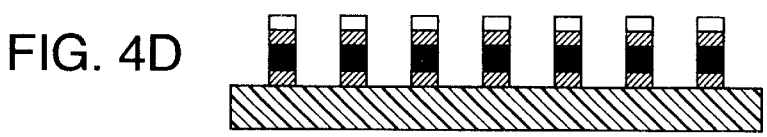
Figure 4E:
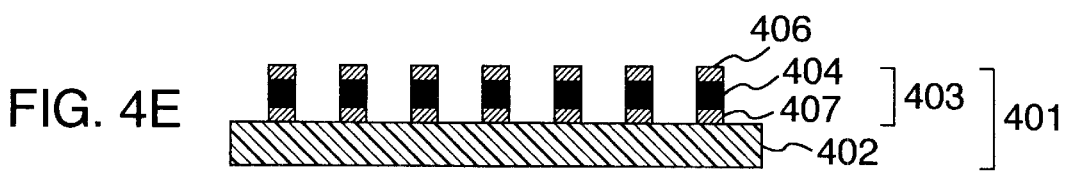

FIGS. 4a to 4e are explanatory drawings showing a method of manufacturing a transfer bump sheet according to the fourth embodiment of the invention, and FIG. 4e is a sectional view which shows the structure of a transfer bump sheet obtained by the fourth manufacturing method. A transfer bump sheet 401 is formed from a base sheet 402 and metal posts 403 and each of the metal posts 403 is formed of three layers, which are a metal layer (metal core) 404, a first solder layer (solder coating) 406 and a second solder layer (solder coating) 407. The basic constitution of the transfer bump sheet 401 is the same as that of the transfer bump sheet 201 obtained by the second manufacturing method.

In the fourth manufacturing method, a solder which can be etched is used. First, by performing electrolytic plating or electroless plating, two solder layers (solder coatings) 406, 407 which become a part of each metal post 403 are formed on the two surfaces (whole area of the surfaces) of metal foil 410 (FIG. 4a). Next, a base sheet 402 is formed on the surface on which the second solder layer (solder coating) 407 of the metal foil 410 was formed (FIG. 4b) and subsequently, etching masks 421 are formed on the other surface (FIG. 4c). The base sheet 402 may be formed by a method of laminating the base sheet, or a method which comprises uniformly applying a resin varnish and then drying the varnish, or a method which comprises uniformly applying a solventless liquid resin and then irradiating the resin with activation energy beams. After that, by etching all the metal foil 410 and two solder layers (solder coatings) 406, 407 at a time through the use of the etching masks 421, the metal posts 403 each of which comprise the metal layer (metal core) 404, first solder layer (solder coating) 406 and second solder layer (solder coating) 407 are formed (FIG. 4d). In this case, it goes without saying that an etchant capable of etching all the metal foil 410 and two solder layers (solder coatings) 406, 407 at a time is used. Finally, by removing the etching masks 421 (FIG. 4e), the transfer bump sheet 401 of the invention is thus obtained.

When the adhesion between the metal post 403 and the base sheet 402 is low, both or either of the second solder layer (solder coating) 407 and base sheet 402 may be subjected to a surface treatment in the same manner as in the second and third manufacturing methods. Further, the method of using the obtained transfer bump sheet 401 is the same as in the case of the transfer bump sheet 201 obtained by the second manufacturing method.

In all of the transfer bump sheets of the first to fourth embodiments, no solder coating is formed on the sides of the metal layer (metal core). By adjusting the amount of solder of solder layer (solder coating) and/or by optimizing the pressure and temperature during transfer and/or by improving the wettability of the metal layer (metal core), the solder is made to flow onto the sides of the metal core of the bump after the transfer. However, there are restrictions regarding the temperature and pressure during transfer, so that there occurs such a case where it is difficult to cause the solder to flow onto the sides of the metal core of the bump after the transfer. In this case, a solder coating may be formed by electrolytic plating or electroless plating after the production of the transfer bump sheet, so that a solder coating is formed also on the sides of the metal layer (metal core) by this treatment, whereby the metal core of the bump after transfer is enveloped in the solder coating even when there are restrictions regarding the temperature and pressure during the transfer.

Figure 5A:
FIGS. 5a to 5e are sectional views which show an example of a method of manufacturing a transfer bump sheet according to the fifth embodiment of the invention.
Figure 5B:
Figure 5C:
Figure 5D:
Figure 5E:
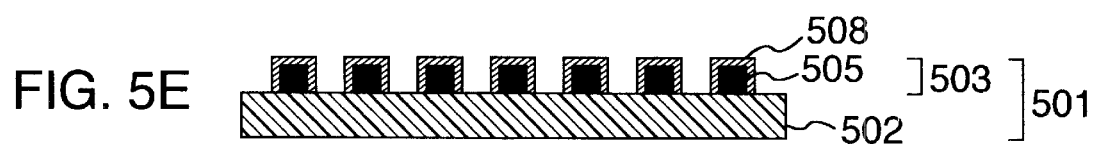

FIGS. 5a to 5e are explanatory drawings showing a method of manufacturing a transfer bump sheet according to the fifth embodiment of the invention, and FIG. 5e is a sectional view which shows the structure of a transfer bump sheet obtained by the fifth manufacturing method. A transfer bump sheet 501 is formed of a base sheet 502 and metal posts 503, and each of the metal posts 503 is formed of a metal core 505 and a solder coating 508.

In the fifth manufacturing method, a two-layer sheet formed of the base sheet 502 and metal foil 510 is first prepared (FIG. 5a). The base sheet 502 may be formed by a method of laminating the base sheet, or by a method which comprises uniformly applying a resin varnish and then drying the varnish, or by a method which comprises uniformly applying a solventless liquid resin and then irradiating the resin with activation energy beams. Next, etching masks 521 are formed on the metal foil 510 (FIG. 5b) and subsequently the metal core 505 which constitutes a part of each metal post 503 is formed by etching the metal foil 510 (FIG. 5c). Next, the etching masks 521 are exfoliated (FIG. 5d), and by performing electroless plating, the solder coating 508 which constitutes another part of each metal post 503 is formed on the surface of the metal core 505 (FIG. 5e). The transfer bump sheet 501 of the invention is thus obtained.

Figure 11A:
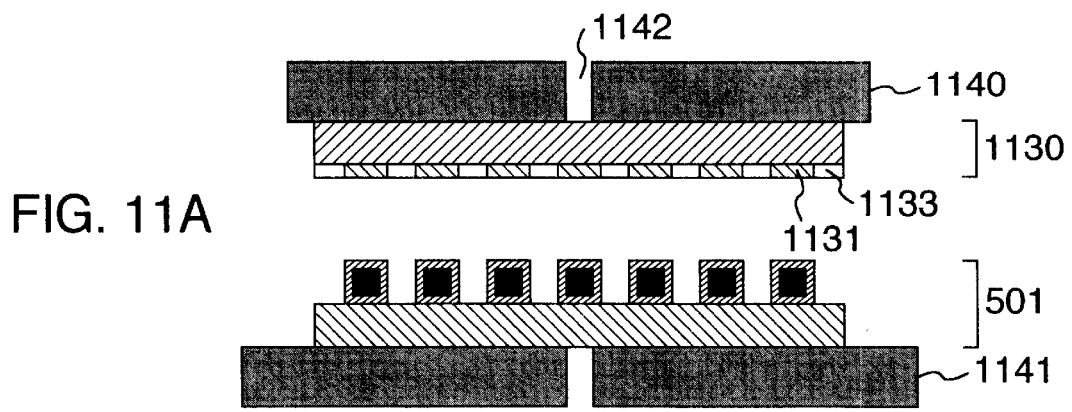
FIGS. 11a to 11d are sectional views which show a method of transferring all bumps at a time to a semiconductor chip (method of manufacturing a semiconductor flip chip) through the use of the transfer bump sheet according to the fifth embodiment of the invention.
Figure 11B:
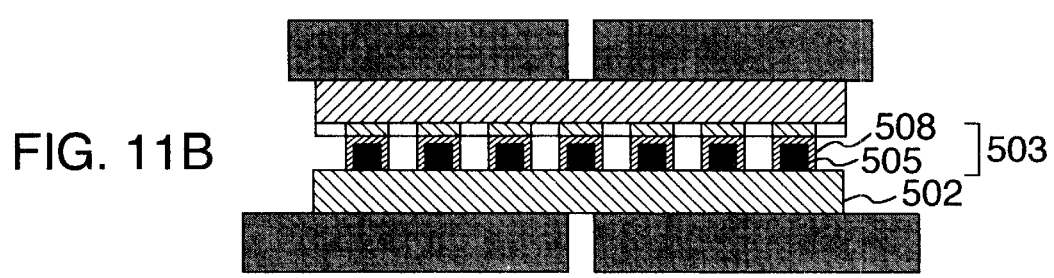
Figure 11C:
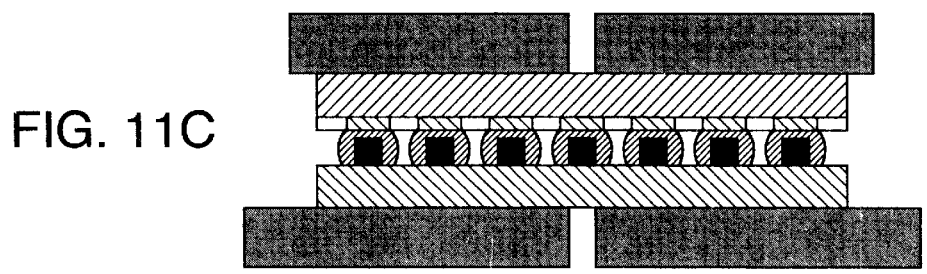
Figure 11D:
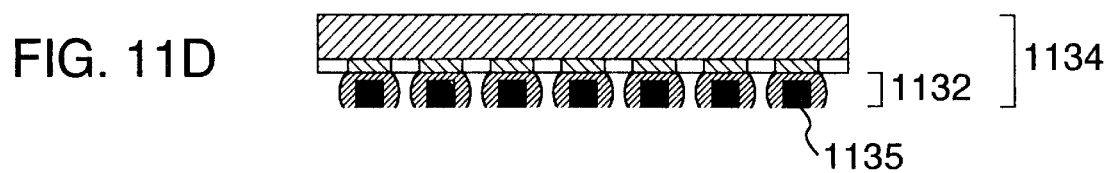

FIGS. 11a to 11d are explanatory drawings showing a method of transferring all bumps at a time to a semiconductor chip, i.e., a method of manufacturing a semiconductor flip chip through the use of the transfer bump sheet 501 obtained by the fifth manufacturing method, and FIG. 11d is a sectional view which shows the structure of a semiconductor flip chip obtained by this manufacturing method. The method of transfer is the same as in the case where the transfer bump sheet 101 according to the above first embodiment is used. However, the behavior of the solder layer (solder coating) during transfer is different from that of the first embodiment. More specifically, because the solder coating 508 is formed on the sides of the metal core 505 before the transfer, the solder coating 508 is deformed to be a shape of balanced surface tension when the solder coating 508 has reached the melting temperature.

In a case of using the transfer bump sheet 501 of the fifth embodiment, as is apparent from FIG. 11d, a metal core 1135 of bump 1132 is exposed on the end face (bottom surface in the drawing) of the transferred bump 1132 similarly to the case of the first embodiment. When the amount of solder of the solder coating 508 is small, bonding by solder for mounting a semiconductor flip chip 1134 on a substrate may sometimes be difficult. However, this problem can be solved by adjusting the amount of solder so that the solder flows onto the exposed surface of a metal core 1135 during mounting.

The metal core 505 which occupies a large part of each metal post 503 is formed by a method which comprises etching the metal foil 510 of uniform thickness and, for this reason, the thickness of the metal core 505 of each metal post 503 is very uniform. Further, because the solder coating 508 is formed by electroless plating, the thickness of the solder coating 508 is very uniform. When electroless plating is displacement plating, the thickness of the metal post 503 is not affected even when the thickness of the solder coating 508 varies in some degree. Therefore, the thickness of the metal post 503 becomes very uniform and no failure in the transfer of bumps due to variations in the thickness of the metal post 503 occurs. Therefore, when bumps are formed on a semiconductor chip through the use of the transfer bump sheet of the fifth embodiment, variations in bump height scarcely occur.

Figure 6A:
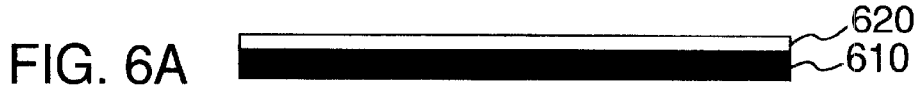
FIGS. 6a to 6h are sectional views which show an example of a method of manufacturing a transfer bump sheet according to the sixth embodiment of the invention.
Figure 6B:
Figure 6C:
Figure 6D:
Figure 6E:
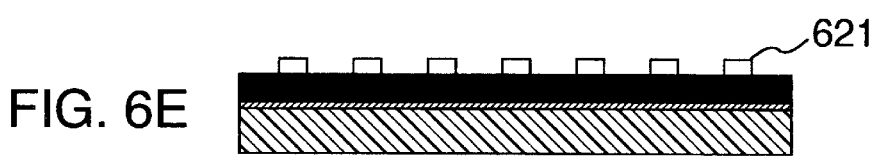
Figure 6F:
Figure 6G:
Figure 6H:
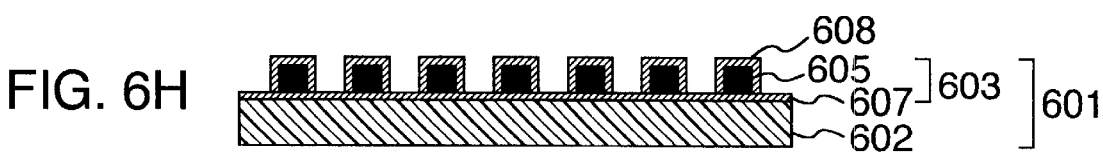

FIGS. 6a to 6h are explanatory drawings showing a method of manufacturing a transfer bump sheet according to the sixth embodiment of the invention, and FIG. 6h is a sectional view which shows the structure of a transfer bump sheet obtained by the sixth manufacturing method. A transfer bump sheet 601 is formed of a base sheet 602 and metal posts 603, and each of the metal posts 603 is formed of a metal core 605, a solder coating 608 and a second solder layer (solder coating) 607 connected to all of the metal posts 603.

In the sixth manufacturing method, a plating mask 620 is first formed on one surface of metal foil 610 (FIG. 6a). Next, by performing electrolytic plating or electroless plating, the second solder layer (solder coating) 607 is formed on the other surface of the metal foil 610 (FIG. 6b) and after that, the plating masks 620 are exfoliated (FIG. 6c). Subsequently, the base sheet 602 is formed on the surface of the metal foil 610 on which the second solder layer (solder coating) 607 was formed (FIG. 6d). The base sheet 602 may be formed by a method of laminating the base sheet, or by a method which comprises uniformly applying a resin varnish and then drying the varnish, or by a method which comprises uniformly applying a solventless liquid resin and then irradiating the resin with activation energy beams. After that, etching masks 621 are formed on the surface of the metal foil 610 (FIG. 6e) and the metal core 605 which constitutes each metal post 603 is formed by etching the metal foil 610 (FIG. 6f). Next, the etching mask 621 is exfoliated (FIG. 6g). Finally, by performing electrolytic plating or electroless plating, the solder coating 608 which constitutes a part of each metal post 603 is formed on the surface of the metal core 605 (FIG. 6h) and the transfer bump sheet 601 of the invention is thus obtained.

When the adhesion between each metal post 603 and the base sheet 602 is low, both or either of the second solder layer (solder coating) 607 and the base sheet 602 may be subjected to surface treatment in the same manner as in each of the second, third or fourth manufacturing methods.

Figure 12A:
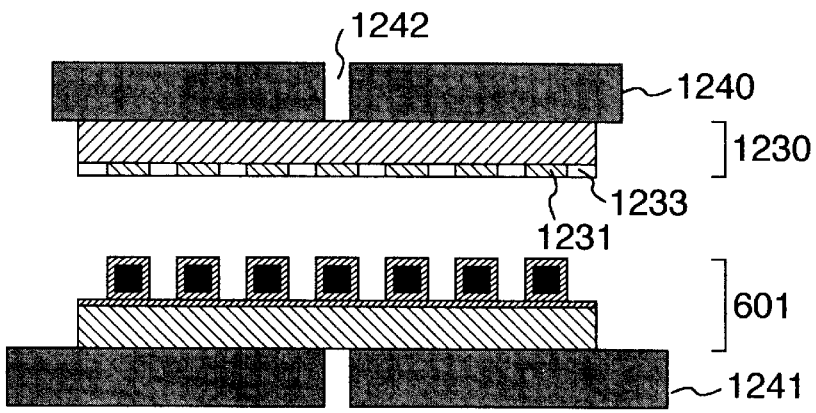
FIGS. 12a to 12d are sectional views which show a method of transferring all bumps at a time to a semiconductor chip (method of manufacturing a semiconductor flip chip) through the use of the transfer bump sheet according to the sixth embodiment of the invention.
Figure 12B:
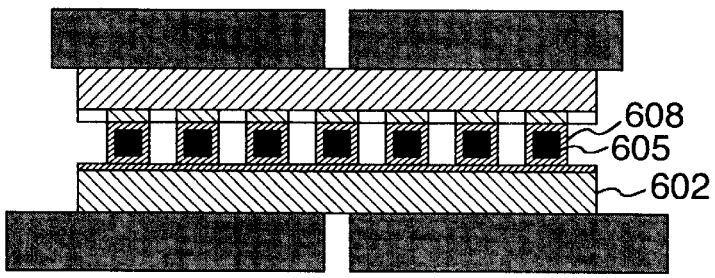
Figure 12C:
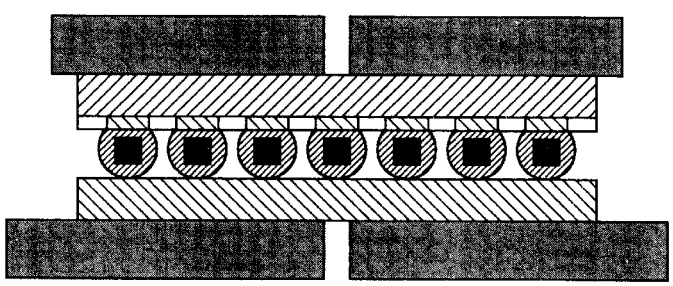
Figure 12D:
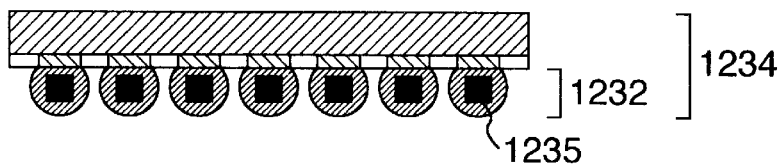

FIGS. 12a to 12d are explanatory drawings showing a method of transferring all bumps at a time to a semiconductor chip, i.e., a method of manufacturing a semiconductor flip chip through the use of the transfer bump sheet 601 obtained by the sixth manufacturing method, and FIG. 12d is a sectional view which shows the structure of the semiconductor flip chip obtained by this manufacturing method. The method of transfer is the same as in the case where the transfer bump sheet 101 according to the above first embodiment is used. However, the behavior of the solder layer (solder coating) during transfer is different from that of the first embodiment. More specifically, the solder is deformed to be a shape of balanced surface tension when the solder has reached the melting temperature. Further, similarly to the case of the third embodiment, adjacent metal posts 603 are prevented from being bridged during the transfer by the presence of the second solder layer (solder coating) 607.

The metal core 605 which occupies a large part of each metal post 603 is formed by a method which comprises etching the metal foil 610 of uniform thickness and, for this reason, the thickness of the metal core 605 of each metal post 603 is very uniform. When the solder coating 608 and second solder layer (solder coating) 607 are formed by electroless plating, the thicknesses of the solder coating 608 and second solder layer (solder coating) 607 are very uniform. When electroless plating is displacement plating, the thickness of each metal post 603 is not substantially affected even when the thickness of the two solder coatings 607, 608 varies in some degree. Therefore, the thickness of the metal post 603 is very uniform and failure in the transfer of bumps due to variations in the thickness of the metal post 603 does not occur. On the other hand, when the solder coating 608 and second solder layer (solder coating) 607 are formed by electrolytic plating, variations in the thickness of the metal post 603 occurs in some degree. However, these thickness variations are so small that they can be neglected in comparison with the conventional technique by which bumps are formed by electrolytic plating alone. Therefore, when bumps are formed on a semiconductor chip through the use of the transfer bump sheet of the sixth embodiment, variations in bump height scarcely occur.

Figure 7A:
FIGS. 7a to 7f are sectional views which show an example of a method of manufacturing a transfer bump sheet of the invention which sheet has a reinforcing plate.
Figure 7B:
Figure 7C:
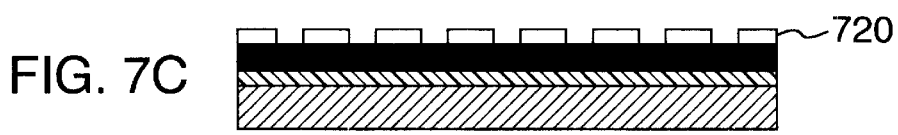
Figure 7D:
Figure 7E:
Figure 7F:
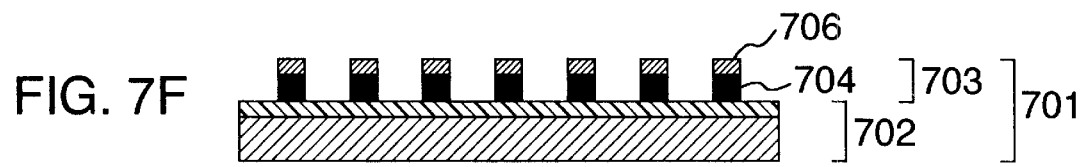

FIGS. 7a to 7f are explanatory drawings showing an example of a method of manufacturing a transfer bump sheet according to the invention having a reinforcing plate, and FIG. 7f is a sectional view which shows the structure of a transfer bump sheet obtained by this manufacturing method. A transfer bump sheet 701 is formed of a base sheet 702 and metal posts 703, and the base sheet 702 is formed of a resin layer 711 and reinforcing plate 712. The constitution of each of the metal posts 703 is the same as that of the metal posts 103 of the transfer bump sheet 101 according to the first embodiment.

In the seventh manufacturing method, a two-layer sheet formed of the resin layer 711 and metal foil 710 is first prepared (FIG. 7a). The two-layer sheet can be obtained by uniformly applying a solventless liquid resin, which is composed of a mixture comprising a photopolymerization resin and a thermosetting resin, on the metal foil 710 and then irradiating the resin with activation energy beams. Next, the reinforcing plate 712 is laminated by heating and pressurizing the opposite surface of the resin layer 711 which surface is not in contact with the metal foil 710 (FIG. 7b). Next, a plating mask 720 is formed on the metal foil 710 (FIG. 7c) and subsequently, by performing electrolytic or electroless coating, a first solder layer (solder coating) 706 which constitutes a part of each metal post 703 is formed on the metal foil 710 (FIG. 7d). After that, the plating mask 720 is exfoliated (FIG. 7e), the metal foil 710 being etched through the use of the formed first solder layer (solder coating) 706 as an etching mask, and the metal layer (metal core) 704 which constitutes a part of each metal post 703 is formed (FIG. 7f). The transfer bump sheet 701 of the invention is thus obtained.

The method of manufacturing the transfer bump sheet shown in FIGS. 7a to 7f is a method in which only a step of forming the reinforcing plate 712 is added to the method of manufacturing the transfer bump sheet 101 (FIGS. 1a to 1e) of the first embodiment. Other transfer bump sheets each having a reinforcing plate can also be produced by adding the step of forming a reinforcing plate to each of the methods of manufacturing transfer bump sheets according to the second to sixth embodiments. Moreover, the transfer bump sheet on which the reinforcing plate is formed can be used in the same method of transfer as in the transfer bump sheets of the first to sixth embodiments.

As regards the reinforcing plate, any one may be used insofar as it can be used in the transfer bump sheet of the invention. However, as a material for the reinforcing plate, a metal, in particular copper (a copper sheet or a copper foil) is preferred. For example, a rolled copper foil of 70 μm thickness can be used as the reinforcing plate.

As described above, in each of the transfer bump sheets of the invention, the metal layer and metal core which become the core of a bump are formed by etching and, therefore, the manufacturing time and the cost of manufacturing can be substantially reduced in comparison with the case where bumps are formed by electrolytic plating or electroless plating alone. Further, in judging from the viewpoint of bump size and reliability of bonding, it is possible to further reduce the manufacturing time and the cost of manufacturing in a case where the ratio of the etching step can be increased by increasing the thickness of metal foil as much as possible.

In this invention, the metal layer and metal core are obtained from a metal foil of uniform thickness by the etching process and, therefore, the metal layer and metal core obtained is uniform without variations in thickness. The solder layer and solder coating obtained by electroless plating are uniform without variations in thickness. When electroless plating is displacement plating, the thickness of the metal post is not substantially affected even when the thicknesses of the solder layer and solder coating vary in some degree. In the solder layer and solder coating formed by electrolytic plating, variations in thickness occur in some degree. However, these thickness variations are so small that they can be neglected in comparison with the conventional technique by which bumps are formed by electrolytic plating alone.

Moreover, in the semiconductor flip chip manufactured through the use of the transfer bump sheet of the invention, the height of bumps is uniform and, therefore, failure in mounting due to variations in the height of bumps do not occur when the semiconductor flip chip is mounted on a substrate. In addition, because the bumps each have a copper core, it is possible to ensure high reliability of bonding after the semiconductor flip chip is exposed to a high temperature.

BEST MODE FOR WORKING THE INVENTION

The invention is described below in more detail by way of the following working examples, which, however, are not intended to restrict the scope of the invention in any way.

In order to prepare the resin for base sheet, 100 parts of brominated novolac-epoxy resin (epoxy equivalent 260, softening point 65° C.) and 20 parts of liquid bisphenol F epoxy resin (epoxy equivalent 175) were dissolved in 80 parts of hydroxyethyl methacrylate, and 3 parts of 2-phenyl-4-methylimidazole as a hardener, 3 parts of benzyldimethylketal (Ilgacure 651 made by CIBA GEIGY AG) as a photoinitiator and 200 parts of silica (average particle size: not more than 10 μm) as an inorganic filler were added to the solution. By sufficiently stirring and mixing the solution by means of three rolls, a liquid resin was obtained. This resin was used as the resin for the base sheets of the following examples 1 to 6.

EXAMPLE 1

After the resin for base sheet obtained above was applied to a 70 μm thick, rolled copper foil (metal foil 110) by use of a comma coater, a 40 μm thick thermosetting resin layer (base sheet 102) was formed by irradiating the resin with activation energy ray under the condition of about 2 J/cm$^2$ by means of a high-voltage mercury-lamp exposure device. By making the resin layer cured at 120° C. for 30 minutes and at 150° C. for 30 minutes by means of a dryer, a two-layer sheet formed of the copper foil and a 20 μm thick resin layer was obtained. Solder plating resists (plating masks 120) were formed on the copper-foil surface of the two-layer sheet, and after the exposure and development thereof, 10 μm thick solder layer (first solder layer 106) was formed by the electrolytic plating of a eutectic Sn—Pb solder. Further, the solder plating resists were exfoliated and after the step of copper foil etching, cylindrical columns of 4096 pieces made of copper (metal layers 104) of 100 μm in diameter were formed with a pitch of 250 μm. The transfer bump sheet 101 according to the first embodiment of the invention was thus produced.

EXAMPLE 2

Solder plating resists (plating masks 220) were formed on the two surfaces of a rolled copper foil (metal foil 210) with a thickness of 70 μm, and after the exposure and development thereof, solder layer (first and second solder layers 206, 207) of 10 μm thickness was formed on the two surfaces by the electrolytic plating of a eutectic Sn—Pb solder. Then, after the solder plating resists on the surface not in contact with the base sheet 202 were exfoliated and the resin for base sheet obtained above was applied to the surface of the copper foil on which the plating resists are formed by use of the comma coater, a thermosetting resin layer (base sheet 202) of 20 μm thickness was formed by irradiating the resin with activation energy ray under the condition of about 2 J/cm$^2$ by means of the high-voltage mercury-lamp exposure device and by making the resin layer cured at 120° C. for 30 minutes and at 150° C. for 30 minutes by means of a dryer. Further, after the step of copper foil etching, 4096 pieces of cylindrical columns of copper (metal layers 204) of 100 μm in diameter were formed with a pitch of 250 μm. The transfer bump sheet 201 according to the second embodiment of the invention was thus produced. In this case, the solder plating resists in contact with the base sheet 202 were not exfoliated.

EXAMPLE 3

Solder plating resists (plating masks 320) were formed on one surface of a rolled copper foil (metal foil 310) of 70 μm thickness, and after the exposure and development thereof, solder layer (first solder layer 306) of 10 μm thickness and solder layer (second solder layer 307 provided on the whole surface of the metal foil) of 5 μm thickness were formed by the electrolytic plating of a eutectic Sn—Pb solder. After that, the resin for base sheet obtained above was applied to the copper foil (whose whole surface had been solder-plated) by use of the comma coater, and a thermosetting resin layer (base sheet 302) of 20 μm thickness was formed by irradiating the resin with activation energy ray under the condition of about 2 J/cm$^2$ by means of the high-voltage mercury-lamp exposure device and by making the resin layer cured at 120° C. for 30 minutes and at 150° C. for 30 minutes by means of a dryer. Further, the solder plating resists were exfoliated, and after the step of copper foil etching, 4096 pieces of cylindrical columns of copper (metal layers 304) of 100 μm in diameter were formed with a 250 μm pitch. The transfer bump sheet 301 according to the third embodiment of the invention was thus produced.

EXAMPLE 4

After the resin for base sheet obtained above was applied to a rolled copper foil (metal foil 510) of 70 μm thickness by use of the comma coater, a thermosetting resin layer (base sheet 502) of 20 μm thickness was formed by irradiating the resin with activation energy ray under the condition of about 2 J/cm$^2$ by means of the high-voltage mercury-lamp exposure device and by making the resin layer cured at 120° C. for 30 minutes and at 150° C. for 30 minutes by means of a dryer, and a two-layer sheet formed of the copper foil and a resin layer of 40 μm thickness was thus obtained. An etching resist was laminated on the copper-foil surface of this two-layer sheet, and after the steps of exposure, development, copper foil etching, and exfoliation of the etching resists, 4096 pieces of cylindrical columns of copper (metal cores 505) of 100 μm in diameter were formed with a pitch of 250 μm. Further, by performing the electroless plating of a eutectic Sn—Pb solder, solder coating (solder coating 508) of 10 μm thickness was formed. The transfer bump sheet 501 according to the fifth embodiment of the invention was thus produced.

EXAMPLE 5

By laminating a solder plating resist (plating mask 620) on one surface of a rolled copper foil (metal foil 610) of 70 μm thickness and by the electroless plating of a eutectic Sn—Pb solder, solder layer (second solder layer 607) of 5 μm thickness was formed. After the solder plating resist was exfoliated and after the resin for base sheet obtained above was applied to the solder-coated surface of the copper foil by use of the comma coater, a thermosetting resin layer of 20 μm thickness (base sheet 602) was formed by irradiating the resin with activation energy ray under the condition of about 2 J/cm² by means of the high-voltage mercury-lamp exposure device and by making the resin layer cured at 120° C. for 30 minutes and at 150° C. for 30 minutes by means of a dryer. An etching resist was laminated on the surface of the copper foil, and after the steps of exposure, development, copper foil etching and exfoliation of the etching resist, 4096 pieces of cylindrical columns of copper (metal cores 605) of 100 μm in diameter were formed with a pitch of 250 μm. Further, by performing the electroless plating of a eutectic Sn—Pb solder, solder coating (solder coating 608) of 10 μm thickness was formed. The transfer bump sheet 601 according to the sixth embodiment of the invention was thus produced.

EXAMPLE 6

After the resin for base sheet obtained above was applied to a rolled copper foil (metal foil 710) of 70 μm thickness by use of the comma coater, a thermosetting resin layer (resin 711) of 20 μm thickness was formed by irradiating the resin with activation energy ray under the condition of about 2 J/cm² by means of the high-voltage mercury-lamp exposure device. A rolled copper foil (reinforcing plate 712) of 70 μm thickness was laminated on the surface of the thermosetting resin layer (which surface is not in contact with the copper foil) by heating and pressurization and, simultaneously, the thermosetting resin layer was cured. A solder plating resist (plating mask 720) was formed on the surface of copper foil (metal foil 710) and after the steps of exposure and development, solder layer (first solder layer 706) of 10 μm thickness was formed by the electrolytic plating of a eutectic Sn—Pb solder. Further, after the exfoliation of the plating resist and after the steps of copper foil etching, 4096 pieces of cylindrical columns of copper (metal layers 704) of 100 μm in diameter were formed with a pitch of 250 μm. The transfer bump sheet 701 with a reinforcing plate according to the seventh invention was thus produced.

Bumps were transferred to a semiconductor chip through the use of the transfer bump sheets fabricated in each of Examples 1 to 6. As regards the transfer conditions, the temperature of the heating and pressurizing tool was 150° C., the temperature of the heating and pressurizing stage being 250° C., the load being 6 kgf per 4096 pieces of bumps, and the heating and pressurizing period of time was 10 seconds. In each example, 10 samples were prepared and transfer experiments were performed under the above conditions. As a result, it was ascertained that in all the samples, 4096 pieces of bumps were completely transferred to each semiconductor chip. The bumps mounted on the semiconductor flip chip were formed with a 250 μm pitch and had a diameter of 120 μm. The height of the bumps was 75 μm in Examples 1, 4 and 6 and 80 μm in Examples 2, 3 and 5.

Variations in height were measured in the bumps transferred through the use of the transfer bump sheets fabricated in Examples 1 to 6. In each example, 20 pieces of random bumps were prepared from the transferred 4096 pieces of bumps and were measured with a laser displacement meter. In all the cases, variations in height were within 5 μm.

Variations in the position of transferred bumps (repeatability) were measured by use of the transfer bump sheets fabricated in Examples 1 and 6. In each example, 5 pieces of random bumps were prepared from the 4096 pieces of transferred bumps, and the coordinates of center position of each bump were measured regarding each of 10 pieces of prepared samples. As the result, maximum variation in position (repeatability) were about 25 μm in Example 1 and about 5 μm in Example 6. It is thought that this is because the base sheet of the transfer bump sheet of Example 6 has the reinforcing plate to thereby bring about stable dimensional behavior although the constitution of the metal posts is the same in Example 1 and Example 6. On the other hand, it is thought that the dimensional behavior of the base sheet of the transfer bump sheet of Example 1 is not stable because the base sheet has no reinforcing plate.

As is apparent from the above results, according to the invention, it is possible to manufacture and supply a low-cost transfer bump sheet capable of transferring all bumps at a time to a semiconductor chip and to substantially improve productivity. Further, by using the transfer bump sheet of the invention, it is possible not only to easily mount bumps on a semiconductor chip, but also to substantially improve the reliability of bonding because each of the transferred bumps has a metal core. Further, in a case where copper is used in the metal layer and metal core (core of bump), electric resistance can also be substantially improved.

What is claimed is:

1. A transfer bump sheet for mounting bumps for flip chip interconnection to a semiconductor chip by transferring all of said bumps at a time to said semiconductor chip, comprising:

a base sheet for said transfer bump sheet, and a plurality of metal posts each provided on the base sheet, each of said metal posts being provided with a pillared metal core having a substantially uniform thickness and a solder coating provided on at least a part of said metal core, said metal core occupying a large part of each of said metal posts, said metal core of the substantially uniform thickness being provided by steps of preparing a metal foil having said substantially uniform thickness, and forming both of said metal core and said solder coating by etching said metal foil and by a plating technique, respectively, wherein said solder coating is provided on a top portion of each of the metal posts, wherein said solder coating is further provided between the metal core and the base sheet, wherein said solder coating provided between the metal core and said base sheet is made to cover a whole face of the base sheet at a side where the metal posts are located.

2. A transfer bump sheet according to claim 1, wherein said metal core is copper.

3. A transfer bump sheet according to claim 1, wherein said base sheet comprises a resin and a reinforcing plate formed on a resin surface opposed to said metal posts.

4. A transfer bump sheet according to claim 1, wherein the metal core has a substantially uniform height.

5. A transfer bump sheet according to claim 1, wherein said base sheet comprises a resin.

6. A transfer bump sheet according to claim 5, wherein adhesion of said resin of the base sheet to said metal posts decreases at about a temperature at which said metal posts are transferred.

7. A transfer bump sheet according to claim 5, wherein said resin of the base sheet is a cured resin material comprising (a) a multifunctional epoxy resin, (b) an epoxy resin hardener, (c) a photopolymerization monomer, (d) a photoinitiator, and (e) an inorganic filler.

8. A transfer bump sheet for mounting bumps for flip chip interconnection to a semiconductor chip by transferring all of said bumps at a time to said semiconductor chip, comprising:

a base sheet for said transfer bump sheet, and a plurality of metal posts each provided on the base sheet, each of said metal posts being provided with a pillared metal core having a substantially uniform thickness and a solder coating provided on at least a part of said metal core , said metal core occupying a large part of each of said metal posts, said metal core of the substantially uniform thickness being provided by steps of preparing a metal foil having said substantially uniform thickness, and forming both of said metal core and said solder coating by etching said metal foil and by a plating technique, respectively, wherein said solder coating is provided so that a metal core portion protruding above the base sheet is covered by the solder coating, wherein said solder coating is further provided between the metal core and the base sheet so that the a whole face of said base sheet is covered by said solder coating at a side where said metal posts are located.

9. A transfer bump sheet according to claim 8, wherein said metal core is copper.

10. A transfer bump sheet according to claim 8, wherein said base sheet comprises a resin and a reinforcing plate formed on a resin surface opposed to said metal posts.

11. A transfer bump sheet according to claim 8, wherein said base sheet comprises a resin.

12. A transfer bump sheet according to claim 11, wherein adhesion of said resin of the base sheet to said metal posts decreases at about a temperature at which said metal posts are transferred.

13. A transfer bump sheet according to claim 11, wherein said resin of the base sheet is a cured resin material comprising (a) a multifunctional epoxy resin, (b) an epoxy resin hardener, (c) a photopolymerization monomer, (d) a photoinitiator, and (e) an inorganic filler.

* * * * *